United States Patent [19]

Cathey

[11] Patent Number: 5,277,715
[45] Date of Patent: Jan. 11, 1994

[54] METHOD OF REDUCING PARTICULATE CONCENTRATION IN PROCESS FLUIDS

[75] Inventor: David A. Cathey, Boise, Id.

[73] Assignee: Micron Semiconductor, Inc., Boise, Id.

[21] Appl. No.: 893,496

[22] Filed: Jun. 4, 1992

[51] Int. Cl.$^5$ .................. B08B 7/00; C03C 23/00
[52] U.S. Cl. ........................... 134/2; 134/3; 134/10; 134/41
[58] Field of Search ............. 134/2, 3, 10, 41

[56] References Cited

U.S. PATENT DOCUMENTS

| | | | |
|---|---|---|---|
| 4,749,440 | 6/1988 | Blackwood et al. | 156/646 |
| 4,752,505 | 6/1988 | Arac | 427/307 |
| 4,778,532 | 10/1988 | McConnell et al. | 134/10 |
| 4,899,767 | 2/1990 | McConnell et al. | 134/56 R |
| 4,917,123 | 4/1990 | McConnell et al. | 134/95 |
| 5,051,134 | 9/1991 | Schnegg et al. | 134/3 |

OTHER PUBLICATIONS

Chiu H. Ting and M. Paunovic, "Selective Electroless Metal Deposition for Integrated Circuit Fabrication," J. Electrochem. Soc., vol. 136, No. 2, Feb. 1989, pp. 456–462.

C. H. Ting, M. Paunovic, P. L. Pai & G. Chiu, "Selective Electroless Metal Deposition for Via Hole Filling in VLSI Multilevel Interconnection Structures" J. Electrochem. Soc., vol. 136, No. 2, Feb. 1989, pp. 462–466.

P. A. Dan, G. Popovici, D. Dascalu, Gh. Brezeanu & Al. Popa, "Structure of Chemically Deposited Ni/Si Contracts," J. Electrochem. Soc., vol. 130, No. 12, Dec. 1983, pp. 2472–2478.

Miles V. Sullivan & John H. Eigler, "Electroless Nickel Plating for Making Ohmic Contracts to Silicon," J. Electrochem. Soc., vol. 104, No. 4, Apr. 1957, pp. 226–230.

Primary Examiner—R. Bruce Breneman
Assistant Examiner—Zeinab El-Arini
Attorney, Agent, or Firm—Stoel Rives Boley Jones & Grey

[57] ABSTRACT

Methods for reducing the number of adherent particulates in processing solutions to avoid deposition of such particulates onto a substrate treated with those processing solutions. For example, hydrogen fluoride-containing acids used to etch silicon dioxide layers during silicon wafer processing produce fluorosilicate particulates that tend to adhere to and contaminate the silicon substrate. Directing the processing solution carrying the fluorosilicate particulates to a filter employing silicon beads to remove the contaminant fluorosilicate particulates before they can recirculate and adhere to the silicon substrate.

21 Claims, 1 Drawing Sheet

METHOD OF REDUCING PARTICULATE CONCENTRATION IN PROCESS FLUIDS

TECHNICAL FIELD

The present invention relates to methods for reducing particulate concentrations in process fluids. More specifically, the invention is directed to the treatment of processing fluids containing hydrofluoric acid to remove particulates therefrom to reduce the number of defects produced while exposing silicon-based wafers to such processing fluids.

BACKGROUND OF THE INVENTION

Wet etching techniques used in the fabrication of integrated circuits on silicon wafers entail exposure of the silicon wafers to one or more etching solutions and one or more cleaning solutions. Such solutions contain particulates that adversely impact the wet etching process, with some of the particulates being formed during the wet etching process itself. U.S. Pat. Nos. 4,899,767, 4,917,123 and 4,778,532 issued to McConnell et al. appear to entail process fluid particulate removal by size-based filters.

For example, hydrogen fluoride-containing acids are used to etch silicon dioxide layers during silicon wafer processing. Fluorosilicate particulates resulting from the etching reaction tend to adhere to the wafers, thereby reducing or destroying the usefulness of a wafer for its intended purpose. Such particulates are difficult to remove by physical (i.e., size-based) filtering techniques. Consequently, methods of removing fluorosilicate and like particulate contaminants from solutions used in the processing of silicon wafers are desired.

SUMMARY OF THE INVENTION

The present invention provides methods for reducing the number of adherent particulates in processing solutions to prevent, for example, deposition of contaminant adherent particulates onto a substrate treated with those processing solutions. A preferred embodiment of the present invention entails achieving a reduction in the number of contaminant fluorosilicate particulates in solutions employed in silicon wafer processing.

The methods of the present invention are implemented by a particulate removal system that includes an adherent particulate removal vessel containing a material for which the adherent particulates exhibit an affinity. Fluorosilicate particulates exhibit a high degree of affinity for silicon surfaces. Consequently, the preferred embodiment of the present invention includes an adherent particulate removal vessel containing silicon beads having a large surface area to which contaminant fluorosilicate particulates adhere. The objective is to use the silicon beads instead of the silicon wafer surface itself to take up contaminant fluorosilicate particulates. Preferably, the adherent particulate removal vessel is periodically purged or the process fluid is otherwise periodically replaced to improve overall process performance.

Optionally, the methods of the present invention may employ one or more physical (i.e., size-based) particulate removal devices, such as filters, located either upstream or downstream of the adherent particulate removal vessel within the particulate removal system. Single, dual, or other multiple size-based filter arrangements may be employed. Such filters may be arranged in a serial, parallel, or combined serial/parallel configuration. Preferably, upstream filters are designed to remove larger sized particulates than those removed by downstream filters.

BRIEF DESCRIPTION OF THE DRAWINGS

The above-mentioned and additional features of the present invention and the manner of obtaining them will become apparent, and the invention will be best understood by reference to the following more detailed description, read in conjunction with the accompanying drawing in which.

DETAILED DESCRIPTION OF PREFERRED EMBODIMENT

Figure 1:
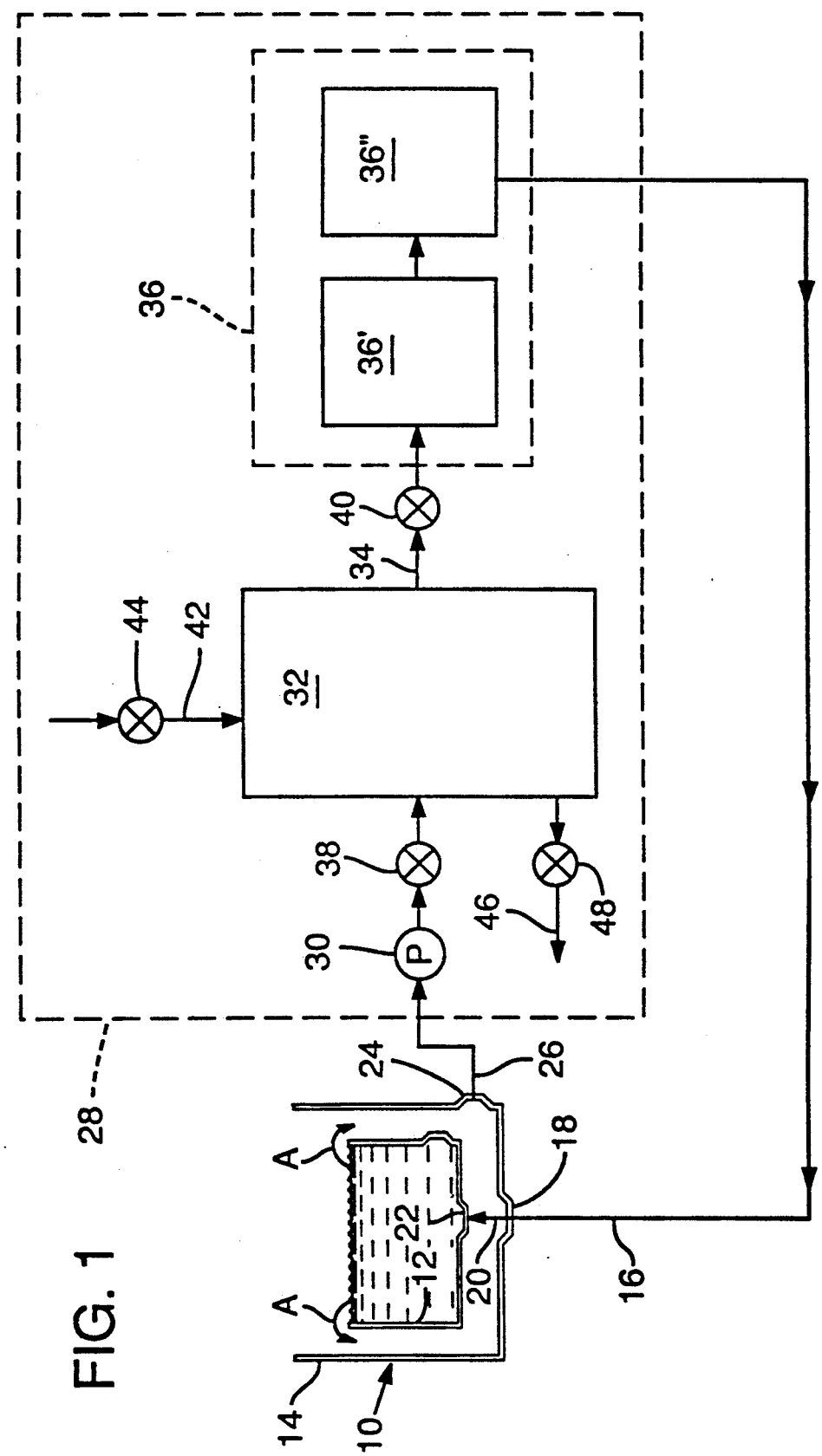
FIG. 1 is a schematic representation of an embodiment of the system of the present invention.

While the present invention is described below with reference to contaminant particulate removal from silicon wafer processing solutions, skilled persons will appreciate the principles of the present invention are applicable in a variety of similar situations. Such situations include, for example, removal of adherent particulates produced as byproducts of a reaction with a reactant material formed on a substrate that desirably remains uncontaminated by such particulates, removal of fluorosilicate particulates from non-wafer processing solutions, removal of other adherent particulates from processing solutions, and the like.

Silicon wafers are exposed to a variety of processing solutions, which include hydrofluoric acid, ammonium fluoride buffered hydrofluoric acid, deionized water, or the like. Any such solution that is contaminated with adherent particulates, such as a phosphoric acid process fluid, may be processed in accordance with the present invention. During wafer processing, any of these processing solutions may be or may become contaminated with adherent particulates, such as fluorosilicates or the like. Fluorosilicate particulates may be removed from hydrofluoric acid solutions using a system as shown in FIG. 1.

With reference to FIG. 1, a dual vessel hydrofluoric acid bath 10 includes an inner vessel 12 and an outer vessel 14. Each of one or more silicon wafers (not shown) coated with a silicon dioxide layer is immersed in inner vessel 12 during the wet etching process. A hydrofluoric acid solution continuously flows into inner vessel 12 through a conduit 16, an outer vessel inlet 18, a conduit 20, and an inner vessel inlet 22. The hydrofluoric acid solution fills inner vessel 12 when the system is operating at steady state and continuously flows out of inner vessel 12 into outer vessel 14 along paths A, as additional solution is supplied to inner vessel 12 through conduit 20.

The etching process resulting from the reaction of the hydrofluoric acid solution and the silicon dioxide layer on the silicon wafers in inner vessel 12 produces and thereby increases the concentration of fluorosilicate particulates in the hydrofluoric acid solution flowing out of inner vessel 12 into outer vessel 14 along paths A. This particulate containing acid solution exits outer vessel 14 through an outlet 24 and a conduit 26 to a particulate removal system 28. Particulate removal system 28 preferably includes a fluid circulation or pump mechanism 30, an adherent particulate removal vessel 32, and, optionally, a size-based particulate removal system 36.

In the embodiment shown in FIG. 1, pump 30 circulates the acid solution from conduit 26 through particulate removal system 28, inner vessel 12, outer vessel 14, and back to conduit 26. Vessel 32 contains a material for which the adherent particulates exhibit an affinity. For example, fluorosilicate particulates adhere to and contaminate the silicon wafers. Consequently, vessel 32 contains silicon in a form having a large exposed surface area to provide an environment conducive to fluorosilicate particulate-silicon contact and adherence. Adherence of the fluorosilicate particulates to the silicon in vessel 32 results in a filtrate or an effluent 34 exhibiting a reduced fluorosilicate particulate concentration.

Effluent 34 may then be fed into a size-based particulate removal system 36, including one or more size-based filters 36' and 36". The additionally filtered effluent of particulate removal system 28 flowing into conduit 16 exhibits reduced concentrations of adherent particulates and no particulates of larger than a certain size.

The flow rate of hydrofluoric acid solution through vessel 32 resulting from the action of pump 30 may be adjusted by an inlet valve 38 and/or an outlet valve 40. In addition, hydrofluoric acid solution being cycled through dual housing bath 10 and particulate removal system 28 may be periodically purged or replaced. In the exemplary purge system shown in FIG. 1, the flow of replacement hydrofluoric acid solution through an inlet purge conduit 42 is controlled by a valve 44, and the flow through an exit purge conduit 46 is controlled by a valve 48.

Dual vessel hydrofluoric acid bath 10 may be sized and configured to process a desired number of silicon wafers and may be formed of any material capable of withstanding continuous interaction with hydrofluoric acid. Vessels useful in the practice of the present invention to form dual vessel hydrofluoric acid baths 10 are known and commercially available.

The preferred hydrofluoric acid solution useful in the practice of the present invention is of a proper concentration for wet etching (i.e., from full strength, about 48% hydrofluoric acid dissolved in water, to about 100:1, 100 parts water to one part full strength solution).

Adherent particulate removal vessel 32 is preferably sized and configured to permit the exposure of the hydrofluoric acid solution flowing therethrough to a large surface area of silicon to which the fluorosilicate particulates present in the solution adhere. The exact dimensions of vessel 32 are dependent upon factors such as the desired hydrofluoric acid solution throughput and the like. Exemplary volumetric dimensions of vessel 32 range from about 6 gallons to about 10 gallons, with about 8 gallons preferred. The silicon material residing in vessel 32 may be in the form of bead-like particulates, which preferably exhibit diameters ranging from about 100 microns to about 1000 microns.

Size-based filters 36' and 36" shown in FIG. 1 represent one configuration of the size-based particulate removal means of the present invention. Single filter or multiple (i.e., greater than two) filter arrangements constitute appropriate alternative size-based particulate removal systems. Generally, when more than one filter is employed as size-based particle removal system 36, an upstream positioned filter encountered by the process fluid is sized and configured to remove larger particles than any downstream positioned filter subsequently contacted by the process fluid. In this manner, the concentration of process fluid particulates of decreasing size may be reduced in a stepwise fashion.

Filters 36' and 36" are formed of any material capable of withstanding continuous interaction with hydrofluoric acid solutions and suitable for filtration of particulates. Filters 36' and 36" useful in the practice of the present invention are known and commercially available from Millipore, for example.

The hydrofluoric acid solution used in the present invention is preferably purged or replaced periodically to ensure that the silicon wafers are exposed to process fluids exhibiting reduced concentrations of fluorosilicate particulate contaminants. One location for such a purge/replacement operation is adherent particulate removal vessel 32, as shown in FIG. 1. The purge/replacement operation may, however, be conducted at any convenient alternative location in practicing the present invention.

The following example demonstrates the operation of the present invention for removing fluorosilicate contaminants produced during etching of a silicon dioxide layer previously formed on a silicon substrate.

EXAMPLE

A 100:1 hydrofluoric acid bath was prepared for 60 second immersion of silicon wafers having a silicon dioxide surface layer. This immersion introduced fluorosilicate particulates into the hydrofluoric acid solution. Bare silicon wafers were similarly immersed in the acid bath and then subjected to a de-ionized water rinse for 10 minutes and to a rinsing/drying process in a rinser/dryer of a type manufactured by Semitool, Inc. A scanning laser particle counting system, such as a Model Kodak/WIS manufactured by Kodak, counted on the wafer surfaces approximately 200 particles of greater than about 0.3 $\mu m$ diameter. The hydrofluoric acid bath was circulated through 0.2 $\mu m$ size-based filters for 24 hours with no wafers present in the bath. Afterwards a bare, clean silicon wafer immersed in the bath and subjected to a particle count revealed approximately 200 counts.

A set of 100 bare, clean silicon wafers was next immersed in the bath, rinsed, dried, and particle counted in the manner described above. A single wafer was then immersed, rinsed, dried and had a particulate count conducted thereon. The particulate count was reduced to approximately 50, thereby indicating the efficacy of bare silicon in reducing the number of fluorosilicate particulates in the process fluid. Finally, a number of silicon wafers having silicon dioxide layers was processed in the bath, which processing resulted in an increase in particle counts for the wafers. The above example demonstrates that fluorosilicate particulates are removed from the hydrofluoric acid solution by contact thereof with clean, bare silicon. In the system of FIG. 1, the hydrofluoric acid process fluid exhibiting a reduced fluorosilicate concentration exits the adherent particulate removal vessel and passes through a flow control valve into one or more size-based particulate filters. A hydrofluoric acid-containing process fluid exhibiting reduced fluorosilicate and large sized particulate concentrations is then recycled back to the dual housing hydrofluoric acid bath.

While in the foregoing specification this invention has been described in relation to certain preferred embodiments thereof, and many details have been set forth for purposes of illustration, it will be apparent to those skilled in the art that the invention is susceptible to additional embodiments and that certain of the details described herein may be varied considerably without departing from the basic principles of the invention.

I claim:

1. A method of reducing the number of adherent particulates in a process fluid, the adherent particulates being formed by a reaction of the process fluid with a material formed on a substrate to which the adherent particulates have an affinity, comprising:
    generating process fluid flow to cause a reaction of the process fluid with the material formed on the substrate, the reaction producing in the process fluid adherent particulates having an affinity for the substrate; and
    directing flow of the process fluid carrying the adherent particulates to contact an adherent particulate removal filter, the filter being composed of a material from which the substrate is made, thereby to remove the adherent particulates from the process fluid by adherence to a filter that includes the same type of material as that of the substrate.

2. A method of reducing particulate concentration in a process fluid, comprising:
    generating process fluid flow; and
    removing adherent particulates from the process fluid by contacting the process fluid with a removal apparatus containing exposed surface area of a material to which the adherent particulates exhibit affinity.

3. A method according to claim 2, which further comprises periodically purging the process fluid.

4. A method according to claim 2 wherein the process fluid comprises an acid selected from the group consisting essentially of hydrofluoric acid and phosphoric acid.

5. A method according to claim 2 wherein the adherent particulates comprise fluorosilicate moieties and the material to which the adherent particulates exhibit affinity comprises silicon.

6. The method of claim 2 further comprising removing particulates on a size basis by passing the process fluid through an apparatus capable of screening particulates.

7. The method of claim 6 wherein removing particulates on a size basis is accomplished by sequentially removing particulates of progressively decreasing size.

8. The method of claim 2 wherein generating process fluid flow includes generating process fluid flow to contact the process fluid with a substrate and wherein the substrate comprises the same material as the material of the particulate removal apparatus to which the adherent particulates exhibit affinity.

9. A method of reducing the number of adherent particulates in a process fluid in contact with a substrate to which the adherent particulates have an affinity, comprising:
    contacting the process fluid carrying the adherent particulates with an adherent particulate removal filter composed of a material to which the adherent particulates have an affinity so as to remove the adherent particulates from the process fluid by adherence to the filter.

10. A method according to claim 9 wherein the process fluid after contacting the adherent particulate removal filter constitutes a filtrate and further comprising causing a sustained reaction between the process fluid and a material formed on the substrate by recirculating the process fluid filtrate to the substrate as a process fluid for maintaining the reaction.

11. A method according to claim 10, further comprising interposing a size-based particulate filter between the adherent particulate removal filter and the substrate to prevent the passage of particulates carried by the process fluid.

12. The method according to claim 9 wherein the process fluid comprises a fluid selected from the group consisting essentially of de-ionized water, hydrofluoric acid, and phosphoric acid.

13. The method according to claim 9 wherein the adherent particulates include fluorosilicate particles.

14. A method of claim 9 wherein the particulate removal filter includes silicon particles characterized by diameters of between about 10 $\mu$m and about 1,000 $\mu$m.

15. A method according to claim 9 wherein the adherent particulates comprises fluorosilicate moieties and the material to which the adherent particulate exhibits affinity comprises silicon.

16. The method of claim 9 wherein the material of which the adherent particulate filter comprises the same material as that of which the substrate is composed.

17. A method according to claim 16 wherein the process fluid after contacting the adherent particulate removal filter constitutes a filtrate and further comprising causing a sustained reaction between the process fluid and a material formed on the substrate by recirculating the process fluid filtrate to the substrate as a process fluid for maintaining the reaction.

18. The method of claim 9, further comprising causing a reaction of the process fluid with a material formed on the substrate, the reaction producing in the process fluid adherent particulates having an affinity for the substrate.

19. A method according to claim 18 wherein the material formed on the substrate comprises silicon dioxide and the substrate comprises silicon.

20. A method according to claim 18 wherein the adherent particulate filter comprises the same material as that of which the substrate is composed.

21. A method of reducing contamination in a process fluid, comprising:
    contacting the process fluid carrying the contamination with a filter comprising silicon, thereby removing the contamination from the process fluid by adhering the contamination to the filter.

* * * * *

UNITED STATES PATENT AND TRADEMARK OFFICE
CERTIFICATE OF CORRECTION

PATENT NO. : 5,277,715
DATED : January 11, 1994
INVENTOR(S) : David A. Cathey

It is certified that error appears in the above-identified patent and that said Letters Patent is hereby corrected as shown below:

Claim 15, line 2, column 6, line 27, change "comprises" to --comprise--.

Signed and Sealed this

Fourteenth Day of June, 1994

Attest:

BRUCE LEHMAN

Attesting Officer  Commissioner of Patents and Trademarks